United States Patent
Sugimoto et al.

(10) Patent No.: US 12,278,061 B1
(45) Date of Patent: Apr. 15, 2025

(54) CONDUCTIVE POLYMER-CONTAINING DISPERSION LIQUID, SOLID ELECTROLYTIC CAPACITOR AND METHOD FOR PRODUCING SAME

(71) Applicant: Resonac Corporation, Tokyo (JP)

(72) Inventors: Shingo Sugimoto, Tokyo (JP); Hiroki Yamada, Tokyo (JP); Takashi Okubo, Tokyo (JP); Yuichiro Asoma, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/839,518

(22) PCT Filed: Dec. 18, 2023

(86) PCT No.: PCT/JP2023/045175
§ 371 (c)(1),
(2) Date: Aug. 19, 2024

(87) PCT Pub. No.: WO2024/135580
PCT Pub. Date: Jun. 27, 2024

(30) Foreign Application Priority Data

Dec. 21, 2022 (JP) ................. 2022-204703

(51) Int. Cl.
*H01G 9/025* (2006.01)
*C09D 5/24* (2006.01)
*C09D 7/63* (2018.01)
*C09D 7/65* (2018.01)
*C09D 125/18* (2006.01)
*H01G 9/00* (2006.01)
*H01G 9/15* (2006.01)

(52) U.S. Cl.
CPC ............... *H01G 9/025* (2013.01); *C09D 5/24* (2013.01); *C09D 7/63* (2018.01); *C09D 7/65* (2018.01); *C09D 125/18* (2013.01); *H01G 9/0036* (2013.01); *H01G 9/15* (2013.01)

(58) Field of Classification Search
CPC ........ H01G 9/025; H01G 9/0036; H01G 9/15; C09D 5/24; C09D 7/63; C09D 7/65; C09D 125/18
See application file for complete search history.

(56) References Cited

U.S. PATENT DOCUMENTS

| | | | |
|---|---|---|---|
| 2012/0283371 A1* | 11/2012 | Wang | C08J 5/18 427/535 |
| 2012/0300370 A1* | 11/2012 | Chacko | H01G 9/028 427/79 |
| 2018/0334577 A1* | 11/2018 | Matsubayashi | H01G 9/048 |
| 2019/0115158 A1* | 4/2019 | Bunha | H01G 9/028 |
| 2020/0402721 A1* | 12/2020 | Kawamoto | C08F 12/30 |
| 2021/0027953 A1* | 1/2021 | Kawahara | H01G 9/0036 |
| 2021/0198469 A1* | 7/2021 | Bunha | C08F 212/30 |
| 2021/0202184 A1* | 7/2021 | Koseki | H01G 9/151 |
| 2022/0262569 A1* | 8/2022 | Chacko | H01G 9/15 |

FOREIGN PATENT DOCUMENTS

| | | | | |
|---|---|---|---|---|
| EP | 4166615 A1 * | 4/2023 | | C03C 17/32 |
| JP | 63-173313 A | 7/1988 | | |
| JP | 2006-351912 A | 12/2006 | | |
| JP | 2008-10663 A | 1/2008 | | |
| JP | 2008-109068 A | 5/2008 | | |
| JP | 2009-196202 A | 9/2009 | | |
| JP | 2014-37504 A | 2/2014 | | |
| KR | 20150012254 A * | 2/2015 | | |
| WO | 2023/162914 A1 | 8/2023 | | |

* cited by examiner

*Primary Examiner* — Dion R. Ferguson
(74) *Attorney, Agent, or Firm* — Sughrue Mion, PLLC

(57) ABSTRACT

Provided are a conductive polymer-containing dispersion for obtaining a solid electrolytic capacitor with low equivalent series resistance (ESR) while maintaining the capacitance, a method for producing same, and a solid electrolytic capacitor having low ESR while maintaining the capacitance. A conductive polymer-containing dispersion comprising a conjugated conductive polymer (A), a polyanion (B), an additive (C), and a dispersion medium (D), wherein a hydrogen bond term $\delta H_1$ of the additive (C) as a Hansen solubility parameter is 5.0 to 20.0 $MPa^{0.5}$.

15 Claims, No Drawings

CONDUCTIVE POLYMER-CONTAINING DISPERSION LIQUID, SOLID ELECTROLYTIC CAPACITOR AND METHOD FOR PRODUCING SAME

CROSS REFERENCE TO RELATED APPLICATIONS

This application is a National Stage of International Application No. PCT/JP2023/045175 filed Dec. 18, 2023, claiming priority based on Japanese Patent Application No. 2022-204703 filed Dec. 21, 2022.

TECHNICAL FIELD

The present invention relates to a conjugated conductive polymer-containing dispersion, a solid electrolytic capacitor using the same, and a method for producing the same.

BACKGROUND ART

Solid electrolytic capacitors usually have a structure in which a valve metal such as aluminum, tantalum, or niobium is included as an anode foil and a cathode foil and a solid electrolyte is interposed between the anode foil and the cathode foil. To increase the capacitance, the surface area of the valve metal for the anode foil is increased by an etching process or the like, and a dielectric oxide film is formed on the surface of the valve metal. Conjugated conductive polymers such as polypyrrole, polyaniline, and polythiophene are used for the solid electrolyte, for example.

Solid electrolytic capacitors are used in electronic devices and the like because the equivalent series resistance (ESR) in a high frequency region can be reduced. Accompanied by recent electrification of vehicles, development of in-vehicle solid electrolytic capacitors has been progressed. In particular, capacitors for electronic control units of vehicles require a further reduction in ESR to increase the output by electronic control.

One of known methods of forming a solid electrolyte using a conductive polymer is, for example, a method of forming a solid electrolyte by impregnating an electrolytic capacitor element with a monomer solution for obtaining a conductive polymer and an oxidant solution, and performing oxidation polymerization or electrolysis polymerization inside the electrolytic capacitor element (see Patent Literature 1, for example).

A method of forming a solid electrolyte by permeating an aqueous dispersion of a conductive polymer into a dielectric oxide film for an anode body is also known. When the solid electrolyte is formed by such a method, the ESR of the solid electrolytic capacitor can be reduced by adding an additive for improving conductivity to the aqueous dispersion of the conductive polymer. For example, Patent Literature 2 discloses use of a water-soluble compound such as ethylene glycol as an additive.

Patent Literature 3 also discloses an electrolytic capacitor comprising a capacitor element and a liquid component, wherein a difference in the Hansen solubility parameter between a liquid component and a self-doped conductive polymer component contained in a capacitor element falls within a predetermined value range.

CITATION LIST

Patent Literature

PTL 1: JP S63-173313 A
PTL 2: JP 2008-109068 A
PTL 3: WO 2023/162914

SUMMARY OF INVENTION

Technical Problem

However, the conductive polymer is formed in the form of spongy aggregates in the polymerization reaction inside the electrolytic capacitor element as disclosed in Patent Literature 1. For this reason, uniformity of the solid electrolyte is poor, and the conductivity is likely to reduce.

In the method using an aqueous dispersion of a conductive polymer, it cannot be said that the solid electrolytic capacitor has sufficiently low ESR even when a solid electrolyte containing the water-soluble compound disclosed in Patent Literature 2 is formed. Even when the electrolytic capacitor containing a self-doped conductive polymer component as disclosed in Patent Literature 3 satisfies a specific numeric value related to the Hansen solubility parameter, it still has a room for reducing the ESR.

The present invention has been made in consideration of such circumstances, and an object of the present invention is to provide a conductive polymer-containing dispersion for obtaining a solid electrolytic capacitor with low ESR and a method for producing the same. Another object of the present invention is to provide a solid electrolytic capacitor with low ESR.

Solution to Problem

The present invention is based on a finding that when a conductive polymer-containing dispersion contains an additive having a value of the hydrogen bond term as the Hansen solubility parameter within a specific range, a solid electrolytic capacitor produced using the conductive polymer-containing dispersion has reduced ESR.

The present invention provides the following means.

[1] A conductive polymer-containing dispersion comprising a conjugated conductive polymer (A), a polyanion (B), an additive (C), and a dispersion medium (D), wherein a hydrogen bond term $\delta H_1$ of the additive (C) as a Hansen solubility parameter is 5.0 to 20.0 $MPa^{0.5}$.

[2] The conductive polymer-containing dispersion according to [1], wherein a content of the additive (C) is 1 to 50 parts by mass per 1 part by mass of the total amount of the conjugated conductive polymer (A) and the polyanion (B).

[3] The conductive polymer-containing dispersion according to [1], further comprising a polymer (E) that is a polymer other than the conjugated conductive polymer (A) and the polyanion (B) and that does not dissolve in the dispersion medium (D).

[4] The conductive polymer-containing dispersion according to [3], wherein a content of the additive (C) is 1 to 50 parts by mass per 1 part by mass of the total amount of the conjugated conductive polymer (A), the polyanion (B), and the polymer (E).

[5] The conductive polymer-containing dispersion according to any one of [1] to [4], wherein the $\delta H_1$ of the additive (C) is 7.0 to 18.0 $MPa^{0.5}$.

[6] The conductive polymer-containing dispersion according to any one of [1] to [5], wherein the additive (C) has a hydroxyl group, and has a molecular weight per one hydroxyl group of 80 to 200.

[7] The conductive polymer-containing dispersion according to any one of [1] to [6], wherein the additive (C) is a compound constituted of a carbon atom, a hydrogen atom, and an oxygen atom.

[8] The conductive polymer-containing dispersion according to any one of [1] to [7], wherein $|δH_1−δH_2|≤6.5$ [MPa$^{0.5}$], where the hydrogen bond term of the polyanion (B) as the Hansen solubility parameter is defined as $δH_2$.
[9] The conductive polymer-containing dispersion according to any one of [1] to [8], wherein a distance Ra between coordinates ($δD_1$, $δP_1$, $δH_1$) and ($δD_2$, $δP_2$, $δH_2$) in a three-dimensional space of the Hansen solubility parameters is 20.0 MPa$^{0.5}$ or less, the distance Ra being represented by $Ra=\{4×(δD_1−δD_2)^2+(δP_1−δP_2)^2+(δH_1−δH_2)^2\}^{0.5}$ where as the Hansen solubility parameters of the additive (C), the dispersion term is defined as $δD_1$, the polar term as $δP_1$, and the hydrogen bond term as $δH_1$, and as the Hansen solubility parameters of the polyanion (B), the dispersion term is defined as $δD_2$, the polar term as $δP_2$, and the hydrogen bond term as $δH_2$.
[10] The conductive polymer-containing dispersion according to any one of [1] to [9], wherein the polyanion (B) is a polymer having two or more groups composed of sulfonic acid or a salt thereof.
[11] The conductive polymer-containing dispersion according to any one of [1] to [10], wherein the dispersion medium (D) has a water content of 1 to 99% by mass.
[12] The conductive polymer-containing dispersion according to any one of [1] to [10], wherein the conjugated conductive polymer (A) is a polymer of a monomer containing one or more compounds selected from the group consisting of pyrroles, anilines, and thiophenes.
[13] The conductive polymer-containing dispersion according to [12], wherein the thiophene compounds are represented by the following formula (1):

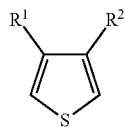

(1)

wherein $R^1$ and $R^2$ are each independently a hydrogen atom, a hydroxyl group, an optionally substituted alkyl group with 1 to 18 carbon atoms, an optionally substituted alkoxy group with 1 to 18 carbon atoms, or an optionally substituted alkylthio group with 1 to 18 carbon atoms; or $R^1$ and $R^2$ may bind to each other to form an optionally substituted alicyclic ring with 3 to 10 carbon atoms, an optionally substituted aromatic ring with 6 to 10 carbon atoms, an optionally substituted oxygen atom-containing hetero ring with 2 to 10 carbon atoms, an optionally substituted sulfur atom-containing hetero ring with 2 to 10 carbon atoms, or an optionally substituted sulfur atom and oxygen atom-containing hetero ring with 2 to 10 carbon atoms.
[14] A method for producing a solid electrolytic capacitor, comprising a step of attaching the conductive polymer-containing dispersion according any one of [1] to [13] to a porous anode body made of a valve metal and having a dielectric coating film on a surface thereof, and removing the dispersion medium (D) to form a solid electrolyte layer.
[15] A solid electrolytic capacitor comprising a solid electrolyte layer in a porous anode body made of a valve metal and having a dielectric coating film on a surface thereof, wherein the solid electrolyte layer contains a conjugated conductive polymer (A), a polyanion (B), and an additive (C), and the hydrogen bond term $δH_1$ of the additive (C) as the Hansen solubility parameter is 5.0 to 20.0 MPa$^{0.5}$.

Advantageous Effects of Invention

The present invention can provide a conductive polymer-containing dispersion for obtaining a solid electrolytic capacitor with low ESR, and a method for producing the same. The present invention also provides a solid electrolytic capacitor with low ESR.

DESCRIPTION OF EMBODIMENTS

Initially, definitions and meanings of the terms and expression in this specification are shown below.
For groups of compounds, "optionally substituted" means that the groups may be either substituted or not substituted (unsubstituted).
The "plural form" after a compound name indicates a group of compounds having the structure of the compound and encompasses the compounds having a substituent. For example, polypyrroles indicate a group of compounds having a polypyrrole structure.
The term "(meth)acrylic acid" is a generic name for acrylic acid and methacrylic acid. Similarly, "(meth)acrylate" is a generic name for acrylate and methacrylate, and "(meth)acryloyl" is a generic name for acryloyl and methacryloyl.
The term "ethylenically unsaturated bond" indicates an ethylenically unsaturated bond having radical polymerizability unless otherwise specified. The term "ethylenically unsaturated monomer" indicates a compound for forming a polymer, the compound having an ethylenically unsaturated bond.
The term "polymer component" indicates the conjugated conductive polymer (A), the polyanion (B), and the polymer (E), and the conjugated conductive polymer (A) and the polyanion (B) when the conductive polymer-containing dispersion does not contain the polymer (E).
Numeric value ranges expressed using "to" each indicate a range including the numeric values shown before and after "to" as the minimum value and the maximum value. In numeric value ranges described stepwise in this specification, the upper limit value or lower limit value of a numeric value range in one step can be arbitrarily combined with the upper limit value or lower limit value of a numeric value range in another step. In numeric value ranges described in this specification, the upper limit value or lower limit value of a numeric value range may be replaced by values shown in Examples.
The Hansen solubility parameters (HSP) are values indicating the solubility of a substance inferred from calculation based on the molecule structure. The HSPs are composed of three parameters, i.e., the dispersion term δD indicating the energy from dispersion forces between molecules, the polar term δP indicating the energy from dipole interaction between molecules, and the hydrogen bond term δH indicating the energy from hydrogen bonds between molecules. The HSPs (δD, δP, and δH) were calculated based on the molecule structure (canonical SMILES) by a Y-MB method in a DIY program of software "HSPiP ver. 5.3.04".
[Conductive Polymer-Containing Dispersion]
The conductive polymer-containing dispersion according to an embodiment according to the present invention (hereinafter, referred to as "the present embodiment") comprises a conjugated conductive polymer (A), a polyanion (B), an additive (C), and a dispersion medium (D), wherein the hydrogen bond term $δH_1$ of the additive (C) as the Hansen solubility parameter is 5.0 to 20.0 MPa$^{0.5}$.

The conductive polymer-containing dispersion according to the present embodiment is preferably a conductive polymer-containing dispersion used in production of a solid electrolytic capacitor (conductive polymer-containing dispersion for a solid electrolytic capacitor).

Use of such a conductive polymer-containing dispersion containing the specific additive (C) enables production of a solid electrolytic capacitor having low ESR without significantly reducing the capacitance. In particular, a solid electrolytic capacitor having low ESR at a high frequency (e.g., 100 kHz) is obtained.

The conductive polymer-containing dispersion according to the present embodiment may further comprise a polymer (E), an alkaline compound (F), and other additives described later.

In a first embodiment, the total content of the conjugated conductive polymer (A), the polyanion (B), a hydroxyl group-containing cyclic ether compound (C), and the dispersion medium (D) in the conductive polymer-containing dispersion is preferably 80 to 100% by mass, more preferably 85 to 100% by mass, still more preferably 90 to 100% by mass.

When the total content falls within the numeric value ranges above, a solid electrolytic capacitor to be produced using the conductive polymer-containing dispersion can have further reduced ESR. In the first embodiment, preferably, any polymer other than the conjugated conductive polymer (A) and the polyanion (B) are not contained.

In the first embodiment, preferably, composite particles (1) containing the conjugated conductive polymer (A) and the polyanion (B) are formed.

In the first embodiment, from the viewpoint of the effect of reducing the ESR of the solid electrolytic capacitor, viscosity of the conductive polymer-containing dispersion which is easy to handle, and dispersibility of the composite particles (1), the total content of the conjugated conductive polymer (A) and the polyanion (B) in the conductive polymer-containing dispersion is preferably 0.1 to 20% by mass, more preferably 0.5 to 15% by mass, still more preferably 1 to 10% by mass.

In a second embodiment, the conductive polymer-containing dispersion may further comprise the polymer (E) in addition to the conjugated conductive polymer (A), the polyanion (B), the additive (C), and the dispersion medium (D).

Use of the conductive polymer-containing dispersion according to second embodiment can further reduce the ESR of the solid electrolytic capacitor.

In the second embodiment, the conductive polymer-containing dispersion may contain the composite particles (2) containing the conjugated conductive polymer (A), the polyanion (B), and the polymer (E). The conductive polymer-containing dispersion may contain the above-mentioned composite particles (1) together with the composite particles (2).

In the second embodiment, the composite particles (2) contained in the conductive polymer-containing dispersion can have any structure without limitation. Preferably, the polymer (E) forms an inner domain of each composite particle (2), and the polyanion (B) is coordinated with the polymer (E) to form an outer domain of the composite particle (2), so that part or all of the domain of the polymer (E) is covered with the conjugated conductive polymer (A) and the polyanion (B).

In the second embodiment, the total content of the conjugated conductive polymer (A), the polyanion (B), the additive (C), the dispersion medium (D), and the polymer (E) in the conductive polymer-containing dispersion is preferably 80 to 100% by mass, more preferably 85 to 100% by mass, still more preferably 90 to 100% by mass.

When the total content falls within the numeric value ranges above, a solid electrolytic capacitor to be produced using the conductive polymer-containing dispersion can have further reduced ESR.

In the second embodiment, from the viewpoint of the effect of reducing the ESR of the solid electrolytic capacitor, viscosity of the conductive polymer-containing dispersion which is easy to handle, and dispersibility of the composite particles (2), the total content of the conjugated conductive polymer (A), the polyanion (B), and the polymer (E) in the conductive polymer-containing dispersion is preferably 0.1 to 20% by mass, more preferably 0.5 to 15% by mass, still more preferably 1 to 10% by mass.

(Conjugated Conductive Polymer (A))

The conjugated conductive polymer (A) is not particularly limited as long as it is an organic high-molecular-weight compound having a π-conjugated system in the main chain. Conjugated conductive polymers may be used alone or in combination. The conjugated conductive polymer (A) may be a homopolymer of a monomer described later or a copolymer of two or more monomers, these monomers forming constitutional units of the conjugated conductive polymer (A). Since the conductive polymer-containing dispersion according to the present embodiment contains the polyanion (B) which functions as a dopant, the conjugated conductive polymer (A) do not have to have a self-doping function.

From the viewpoint of dispersion stability of the conductive polymer-containing dispersion and a reduction in ESR of the solid electrolytic capacitor produced using the conductive polymer-containing dispersion, the content of the conjugated conductive polymer (A) is preferably 5 to 70% by mass, more preferably 10 to 60% by mass, still more preferably 15 to 50% by mass in 100% by mass of the polymer components contained in the conductive polymer-containing dispersion according to the present embodiment.

Examples of the conjugated conductive polymer (A) include polypyrroles, polythiophenes, polyisothianaphthenes, polyacetylenes, polyphenylenes, polyphenylene vinylenes, polyanilines, polyacenes, polythiophene vinylenes, and copolymers thereof. Among these, polypyrroles, polythiophenes, and polyanilines are preferred, and polythiophenes are more preferred from the viewpoint of case in handling and availability.

From the viewpoint of high conductivity, the conjugated conductive polymer (A) preferably has a substituent such as an alkyl group, a carboxy group, a sulfo group, an alkoxy group, a hydroxyl group, or a cyano group.

Examples of the polypyrroles include polypyrrole, poly (N-methylpyrrole), poly(3-methylpyrrole), poly(3-ethylpyrrole), poly(3-n-propylpyrrole), poly(3-butylpyrrole), poly (3-octylpyrrole), poly(3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly (3-butoxypyrrole), poly(3-hexyloxypyrrole), poly(3-methyl-4-hexyloxypyrrole), and poly(3-methyl-4-hexyloxypyrrole).

Examples of the polythiophenes include polythiophene, poly(3-methylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3-chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3,4-dihydroxythiophene), poly(3,4-dimethoxythiophene), poly(3,4-diethoxythiophene), poly(3,4-dipropoxythiophene), poly(3,4-dibutoxythiophene), poly(3,4-dihexyloxythiophene), poly(3,4-diheptyloxythiophene), poly(3,4-dioctyloxythiophene), poly(3,4-didecyloxythiophene), poly(3,4-didodecyloxythiophene), poly(3,4-ethylenedioxythiophene), poly(3,4-propylenedioxythiophene), poly(3,4-butylenedioxythiophene), poly(3-methyl-4-methoxythiophene), poly(3-methyl-4-ethoxythiophene), poly(3-carboxythiophene), poly(3-methyl-4-carboxythiophene), poly(3-methyl-4-carboxyethylthiophene), poly(3-methyl-4-carboxybutylthiophene), and poly(3,4-ethyleneoxythiathiophene).

Examples of the polyanilines include polyaniline, poly(2-methylaniline), poly(3-isobutylaniline), poly(2-anilinesulfonic acid), and poly(3-anilinesulfonic acid).

Among these compounds, polypyrrole, polythiophene, poly(N-methylpyrrole), poly(3-methylthiophene), poly(3-methoxythiophene), and poly(3,4-ethylenedioxythiophene) are preferred from the viewpoint of high conductivity, conjugated conductive polymer (A), and further, poly(3,4-ethylenedioxythiophene) is more preferred from the viewpoint of high heat resistance.

The monomer for obtaining the conjugated conductive polymer (A), namely, the monomer forming the constitutional unit of the conjugated conductive polymer (A) preferably contains one or more compounds selected from the group consisting of pyrroles, anilines, and thiophenes. The compound may have a substituent X, and examples of the substituent X include alkyl groups with 1 to 18 carbon atoms, aryl groups with 6 to 10 carbon atoms, heteroaryl groups with 5 to 10 carbon atoms, alkoxy groups with 1 to 18 carbon atoms, alkylthio groups with 1 to 18 carbon atoms, a carboxy group, a hydroxyl group, halogen atoms, and a cyano group. Two or more of these substituents X may bind to each other by condensation to form a ring. These alkyl groups, aryl groups, heteroaryl groups, alkoxy groups, and alkylthio groups may have another substituent Y such as a carboxy group, a hydroxyl group, a halogen atom, or a cyano group.

Examples of the monomer as the constitutional unit of the conjugated conductive polymer (A) include pyrroles such as pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, and 3-methyl-4-hexyloxypyrrole; thiophenes such as thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butylenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, and 3,4-ethyleneoxythiathiophene; and anilines such as aniline, 2-methylaniline, 3-isobutylaniline, 2-anilinesulfonic acid, and 3-anilinesulfonic acid. These may be used alone or in combination.

To obtain a conjugated conductive polymer having high conductivity, the monomer forming the constitutional unit of the conjugated conductive polymer (A) preferably contains a thiophene compound represented by the following formula (1) among these compounds. These compounds represented by the formula (1) may be used alone or in combination.

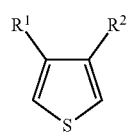

(1)

In the formula (1), $R^1$ and $R^2$ are each independently a hydrogen atom, a hydroxyl group, an optionally substituted alkyl group with 1 to 18 carbon atoms, an optionally substituted alkoxy group with 1 to 18 carbon atoms, or an optionally substituted alkylthio group with 1 to 18 carbon atoms; or $R^1$ and $R^2$ may bind to each other to form an optionally substituted alicyclic ring with 3 to 10 carbon atoms, an optionally substituted aromatic ring with 6 to 10 carbon atoms, an optionally substituted oxygen atom-containing hetero ring with 2 to 10 carbon atoms, an optionally substituted sulfur atom-containing hetero ring with 2 to 10 carbon atoms, or an optionally substituted sulfur atom and oxygen atom-containing hetero ring with 2 to 10 carbon atoms.

Here, examples of substituents for substitution include a carboxy group, a hydroxyl group, halogen atoms, and a cyano group.

The oxygen atom-containing hetero ring preferably contains 1 to 3 oxygen atoms for constituting the ring, and examples thereof include an oxirane ring, an oxetane ring, a furan ring, a hydrofuran ring, a pyran ring, a pyrone ring, a dioxane ring, and a trioxane ring.

The sulfur atom-containing hetero ring preferably contains 1 to 3 nitrogen atoms for constituting the ring, and examples thereof include a thiirane ring, a thietane ring, a thiophene ring, a thiane ring, a thiopyran ring, a thiopyrylium ring, a benzothiopyran ring, a dithiane ring, a dithiolane ring, and a trithiane ring.

The sulfur atom and oxygen atom-containing hetero ring preferably contains a total of 1 to 3 sulfur and oxygen atoms for constituting, and examples thereof include an oxathiolane ring and an oxathiane ring.

From the viewpoint of uniformity and favorable conductivity of the conjugated conductive polymer (A), the content of the compound represented by the formula (1) is preferably 90 to 100% by mass, more preferably 95 to 100% by mass, still more preferably 100% by mass in the monomer forming the constitutional unit of the conjugated conductive polymer (A).

Among these compounds represented by the formula (1), the monomer as the constitutional unit of the conjugated conductive polymer (A) contains preferably a compound represented by the following formula (2), more preferably 3,4-ethylenedioxythiophene.

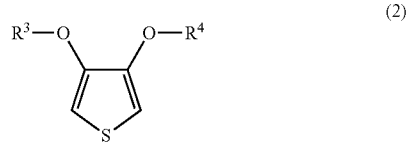

(2)

In the formula (2), $R^3$ and $R^4$ are each independently a hydrogen atom, an optionally substituted alkyl group with 1 to 4 carbon atoms, or $R^3$ and $R^4$ may bind to each other to form an optionally substituted oxygen atom-containing hetero ring with 3 to 6 carbon atoms.

$R^3$ and $R^4$ preferably bind to each other to form an optionally substituted oxygen atom-containing hetero ring with 3 to 6 carbon atoms f.

The oxygen atom-containing hetero ring preferably contains 1 to 3 oxygen atoms for constituting the ring, and examples thereof include a dioxane ring and a trioxane ring. Preferred is a dioxane ring. The oxygen atom-containing hetero ring is preferably unsubstituted.

Here, the substituents for substitution are the same as those as the substituent Y described above, and examples thereof include a carboxy group, a hydroxyl group, halogen atoms, and a cyano group.

(Polyanion (B))

The polyanion (B) is a polymer having two or more anionic groups. It functions as a dopant for the conjugated conductive polymer (A). In the composite particles (2) according to the second embodiment, it is considered that the polyanion (B) is coordinated with the outer side of the polymer (E) forming the domain, and acts as a protective colloid.

From the viewpoint of stability in the conductive polymer-containing dispersion and a reduction in ESR of the solid electrolytic capacitor produced using the conductive polymer-containing dispersion, the content of the polyanion (B) in 100% by mass of the polymer components contained in the conductive polymer-containing dispersion according to the present embodiment is preferably 30 to 95% by mass, more preferably 40 to 90% by mass, still more preferably 50 to 85% by mass.

The content of the polyanion (B) is preferably 45 to 1900 parts by mass, more preferably 70 to 900 parts by mass, still more preferably 100 to 500 parts by mass relative to 100 parts by mass of the conjugated conductive polymer (A).

Examples of the anionic groups include groups composed of sulfonic acid or a salt thereof, groups composed of phosphoric acid or a salt thereof, monosubstituted phosphoric acid ester groups, groups composed of carboxylic acid or a salt thereof, and monosubstituted sulfuric acid ester groups. Among these, strong acidic groups are preferred, groups composed of sulfonic acid or a salt thereof and groups composed of phosphoric acid or a salt thereof are more preferred, and groups composed of sulfonic acid or a salt thereof are still more preferred. In other words, the polyanion (B) is preferably a polymer having two or more groups composed of sulfonic acid or a salt thereof.

Examples of salts include salts of sodium, potassium, magnesium, calcium, and ammonium.

The anionic groups may be attached to the main chain of the polymer constituting the polyanion (B), or may be attached to the side chains thereof. When the anionic groups are attached to the side chains, the anionic groups are preferably attached to side-chain ends of the polymer to obtain a prominent doping effect to the conjugated conductive polymer (A). The anionic group may be directly attached to the main chain, or may be attached thereto via another structure. Preferably, the anionic group is attached via a benzene ring. In this case, more preferably, the anionic group is attached to the para-position of the main chain.

The polyanion (B) may have a substituent other than the anionic group.

The substituent may be attached to the main chain of the polymer constituting the polyanion (B), or may be attached to the side chains thereof. When the substituent is attached to the side chain, the substituent is preferably attached to a side-chain end to demonstrate the properties of the substituent.

The main chain structure of the polymer constituting the polyanion (B) is not particularly limited. From the viewpoint of synthesis and availability, it is preferably polyalkylenes such as polyethylene.

Preferably, the polyanion (B) is a compound having a group composed of a sulfonic acid or a salt thereof as the anionic group, as described above, because such a compound enhances the dispersibility of the monomer as the constitutional unit of the conjugated conductive polymer (A) in the dispersion medium (D).

Examples of polyanions having a group composed of sulfonic acid, that is, a sulfo group ($—SO_2OH$) include polyvinylsulfonic acid, polystyrenesulfonic acid, polyallylsulfonic acid, polyethyl acrylate sulfonic acid, polybutyl acrylate sulfonic acid, poly(2-acrylamide-2-methylpropanesulfonic acid), polyisoprene sulfonic acid, and copolymers thereof. Among these, polystyrenesulfonic acid, polyisoprenesulfonic acid, polyethyl acrylate sulfonic acid, and polybutyl acrylate sulfonic acid are preferred, and polystyrenesulfonic acid is more preferred from the viewpoint of stability in the conductive polymer-containing dispersion and a reduction in ESR of the solid electrolytic capacitor produced using the conductive polymer-containing dispersion.

The polyanion (B) contained in the conductive polymer-containing dispersion and the polyanion used in the process of producing the conductive polymer-containing dispersion may have the same structure, or may have different structures (for example, structures where different cations attached). For example, from the viewpoint of water-solubility, in the production process, sodium polystyrenesulfonate is suitably as the polyanion, and may be converted to polystyrenesulfonic acid by ion exchange or the like in the latter desalting step.

The polyanion (B) can be produced by a known production method described in JP 2005-76016 A, and a commercial product can also be used.

The polyanion (B) has a weight average molecular weight of preferably 1000 to 1000000, more preferably 5000 to 500000, still more preferably 50000 to 300000 from the viewpoint of the solubility to the dispersion medium (D) and the doping effect to the conjugated conductive polymer (A).

The weight average molecular weight herein indicates the standard polystyrene-based molecular weight measured by gel permeation chromatography. Specifically, the weight average molecular weight is measured by the method described in Examples.

In consideration of the relation with the HSP of the additive (C) described later, the hydrogen bond term $\delta H_2$ of the polyanion (B) as the HSP is preferably 5.0 to 20.0 $MPa^{0.5}$, more preferably 9.0 to 18.0 $MPa^{0.5}$, still more preferably 10.0 to 16.0 $MPa^{0.5}$.

The dispersion term $\delta D_2$ of the polyanion (B) as the HSP is 1.0 to 50.0 $MPa^{0.5}$, more preferably 5.0 to 40.0 $MPa^{0.5}$, still more preferably 9.0 to 30.0 $MPa^{0.5}$.

The polar term $\delta P_2$ of the polyanion (B) as the HSP is preferably 3.0 to 30.0 $MPa^{0.5}$, more preferably 6.0 to 20.0 $MPa^{0.5}$, still more preferably 9.0 to 15.0 $MPa^{0.5}$.

(Additive (C))

In the additive (C), the hydrogen bond term $\delta H_1$ as the HSP is 5.0 to 20.0 $MPa^{0.5}$, preferably 7.0 to 18.0 $MPa^{0.5}$, more preferably 9.0 to 16.5 $MPa^{0.5}$, still more preferably 10.0 to 14.8 $MPa^{0.5}$.

The additive (C) has action to improve the conductivity of the conductive polymer-containing dispersion and reduce the ESR of the solid electrolytic capacitor produced using the conductive polymer-containing dispersion. It is inferred that addition of the additive (C) where the $\delta H_1$ as the HSP falls within the numeric value ranges above may exert some advantageous influences over an improvement in conductivity of the conduction path to be formed of the conductive polymer-containing dispersion containing the conjugated conductive polymer (A) and the polyanion (B), thus reducing the ESR of the solid electrolytic capacitor. By adding the additive (C), a solid electrolytic capacitor having low ESR at a high frequency (e.g., 100 kHz) in particular is likely to be obtained.

For the hydrogen bond term $\delta H_1$ of the additive (C) as the HSP and the hydrogen bond term $\delta H_2$ of the polyanion (B) as the HSP, $|\delta H_1 - \delta H_2| \leq 6.5$ is preferred, that is, the difference (absolute value) between $\delta H_1$ and $\delta H_2$ is preferably 6.5 $MPa^{0.5}$ or less, more preferably 5.0 $MPa^{0.5}$ or less, still more preferably 3.0 $MPa^{0.5}$ or less, further still more preferably 2.5 $MPa^{0.5}$ or less, particularly preferably 1.1 $MPa^{0.5}$ or less.

It is considered that as the difference (absolute value) between $\delta H_1$ and $\delta H_2$ becomes smaller, the action of the additive (C) which enhances the dopant function of the polyanion (B) is further increased, and the ESR is more likely to be reduced without significantly reducing the capacitance of the solid electrolytic capacitor produced using the conductive polymer-containing dispersion.

From the same viewpoint as above, for the dispersion term $\delta D_1$, the polar term $\delta P_1$, and the hydrogen bond term $\delta H_1$ as the HSPs of the additive (C) and the dispersion term $\delta D_2$, the polar term $\delta P_2$, and the hydrogen bond term $\delta H_2$ as the HSPs of the polyanion (B), the distance Ra between coordinates in a three-dimensional space of the HSPs ($\delta D_1$, $\delta P_1$, $\delta H_1$) and ($\delta D_2$, $\delta P_2$, $\delta H_2$) is preferably 20.0 $MPa^{0.5}$ or less, more preferably 15.0 $MPa^{0.5}$ or less, still more preferably 12.5 $MPa^{0.5}$ or less, preferably 1.0 $MPa^{0.5}$ or more, more preferably 3.0 $MPa^{0.5}$ or more, still more preferably 5.0 $MPa^{0.5}$ or more, where the distance Ra is represented by $Ra = \{4 \times (\delta D_1 - \delta D_2)^2 + (\delta P_1 - \delta P_2)^2 + (\delta H_1 - \delta H_2)^2\}^{0.5}$.

It is considered that when the distance Ra falls within the numeric value ranges above, the compatibility between the additive (C) and the polyanion (B) is enhanced, the action of the additive (C) which enhances the dopant function of the polyanion (B) is enhanced, and the ESR is likely to be reduced without reducing the capacitance of the solid electrolytic capacitor produced using the conductive polymer-containing dispersion.

The dispersion term $\delta D_1$ as the HSP of the additive (C) is preferably 10.0 to 30.0 $MPa^{0.5}$, more preferably 13.0 to 25.0 $MPa^{0.5}$, still more preferably 15.0 to 20.0 $MPa^{0.5}$. The polar term $\delta P_1$ as the HSP of the additive (C) is preferably 1.0 to 50.0 $MPa^{0.5}$, more preferably 5.0 to 40.0 $MPa^{0.5}$, still more preferably 9.0 to 30.0 $MPa^{0.5}$, further still more preferably 15.0 to 25.0 $MPa^{0.5}$.

To readily enhance the action to the polyanion (B), the additive (C) is preferably a compound having a hydroxyl group. The molecular weight per one hydroxyl group of the compound is preferably 80 to 200, more preferably 90 to 180, still more preferably 110 to 160, further still more preferably 120 to 140.

When the molecular weight per one hydroxyl group is 80 or more, the dispersion medium (D), particularly a dispersion medium having a hydroxyl group and water are readily vaporized in the process of producing the solid electrolytic capacitor, leading to a reduction in cost for removing the dispersion medium (D). When the molecular weight per one hydroxyl group is 200 or less, such an additive (C) is effective in reducing the ESR of the solid electrolytic capacitor produced using the conductive polymer-containing dispersion.

To reduce the ESR of the solid electrolytic capacitor, the additive (C) is preferably a compound having a carbonyl group. The compound is preferably constituted of a carbon atom, a hydrogen atom, and an oxygen atom.

Specific examples of the additive (C) include 2,2-dimethyl-1,3-dioxolan-4-ol, 2,2-dimethyl-1,3-dioxolane-4-methanol, 2,2-dimethyl-1,3-dioxolane-4-ethanol, 1,3-dioxolan-4-ol, 1,3-dioxolane-4-methanol, 1,3-dioxolane-4-ethanol, 4-hydroxy-1,3-dioxolan-2-one, 4-hydroxymethyl-1,3-dioxolan-2-one, 4-(2-hydroxyethyl)-1,3-dioxolan-2-one, 1,3-dioxan-4-ol, 1,3-dioxane-4-methanol, 1,3-dioxane-4-ethanol, 1,3-dioxan-5-ol, 1,3-dioxane-5-methanol, and 1,3-dioxane-5-ethanol. Among these, 2,2-dimethyl-1,3-dioxolane-4-methanol, 4-hydroxymethyl-1,3-dioxolan-2-one, 2,2-dimethyl-1,3-dioxolane-4-ethanol, and 1,3-dioxan-5-ol are preferred.

From the viewpoint of stability of the conductive polymer-containing dispersion and solid electrolytic capacitor and an effective reduction in ESR, the content of the additive (C) in the conductive polymer-containing dispersion according to the present embodiment is preferably 1 to 50 parts by mass, more preferably 2 to 40 parts by mass, still more preferably 4 to 30 parts by mass, further still more preferably 10 to 25 parts by mass, particularly preferably 15 to 25 parts by mass per 1 part by mass of the total amount of the polymer components contained in the polymer-containing dispersion.

The content of the additive (C) in the conductive polymer-containing dispersion is preferably 0.5 to 50% by mass, more preferably 3 to 40% by mass, still more preferably 6 to 30% by mass, further still more preferably 12 to 30% by mass, particularly preferably 20 to 30% by mass.

(Dispersion Medium (D))

The conductive polymer-containing dispersion according to the present embodiment can contain any dispersion medium (D) without limitation. Preferably, the dispersion medium (D) can maintain the conductive polymer-containing dispersion more efficiently with high dispersion stability. The dispersion medium (D) preferably can dissolve or disperse the additive (C), more preferably can dissolve the additive (C), and still more preferably can completely dissolve the additive (C) contained in the conductive polymer-containing dispersion.

Examples of the dispersion medium (D) include water; amides such as N-vinylpyrrolidone, hexamethylphosphotriamide, N-vinylformamide, and N-vinylacetoamide, phenols such as cresol, phenol, and xylenol; polyhydric alcohols such as dipropylene glycol, 1,3-butylene glycol, 1,4-butylene glycol, diglycerol, isoprene glycol, butanediol, 1,5-pentanediol, 1,6-hexanediol, 1,9-nonanediol, and neopentyl glycol; carbonate compounds such as ethylene carbonate and propylene carbonate; ethers such as dioxane, diethyl ether, propylene glycol dialkylether, polyethylene glycol dialkylether, and polypropylene glycol dialkylether; heterocyclic compounds such as 3-methyl-2-oxazolidinone; and nitriles such as acetonitrile, glutarodinitrile, methoxyacetonitrile, propionitrile, and benzonitrile. These dispersion mediums (D) may be used alone or in combination. Among these, preferably, 1 to 99% by mass of water is contained, more preferably, 50 to 99% by mass of water is more preferably contained, and still more preferably, only water is contained from the viewpoint of favorable dispersion stability of the conductive polymer-containing dispersion and ease in production From the viewpoint of desired viscosity and dispersion stability of the conductive polymer-containing dispersion, the content of the dispersion medium (D) in the conductive polymer-containing dispersion is preferably 30 to 98% by mass, more preferably 45 to 97% by mass, still more preferably 60 to 94% by mass.

(Polymer (E))

The polymer (E) is a polymer other than the conjugated conductive polymer (A) and the polyanion (B), and does not dissolve in the dispersion medium (D).

The content of the polymer (E) in 100% by mass of the polymer components contained in the conductive polymer-containing dispersion according to the present embodiment is preferably 0 to 50% by mass, more preferably 0 to 40% by mass, still more preferably 0 to 25% by mass from the viewpoint of dispersion stability of the conductive polymer-containing dispersion and a reduction in ESR of the solid electrolytic capacitor produced using the conductive polymer-containing dispersion.

The polymer (E) is not particularly limited, and for example, the polymer (E) is preferably a polymer containing a constitutional unit derived from an ethylenically unsaturated monomer, more preferably a polymer composed of a constitutional unit derived from an ethylenically unsaturated monomer. The polymer (E) is preferably a nonionic polymer, and more preferably composed of a hydrocarbon. The polymer (E) may contain one or both of a homopolymer (homopolymer) and a copolymer (copolymer). These polymers (E) may be used alone or in combination, and may be either crystalline or amorphous, preferably is amorphous. The polymer (E) may have a cross-linking structure.

Examples of the ethylenically unsaturated monomer derived from the constitutional unit of the polymer (E) include (meth)acrylates having a linear, branched, or cyclic alkyl group; aromatic vinyl compounds such as styrene and α-methylstyrene; heterocyclic vinyl compounds such as vinylpyrrolidone; hydroxyalkyl (meth)acrylates; dialkylaminoalkyl (meth)acrylates such as 2-ethylhexyl (meth)acrylate; vinyl esters such as vinyl acetate and vinyl alkanoate; monoolefins such as ethylene, propylene, butylene, and isobutylene; conjugated diolefins such as butadiene, isoprene, and chloroprene; α,β-unsaturated mono- or dicarboxylic acids such as (meth)acrylic acid, crotonic acid, itaconic acid, maleic acid, and fumaric acid; vinyl cyanide compounds such as acrylonitrile; and carbonyl group-containing vinyl compounds such as acrolein and diacetone acrylamide. These ethylenically unsaturated monomers may be used alone or in combination.

The polymer (E) may have a cross-linking structure. Examples of the cross-linking structure include a structure derived from a compound having a plurality of independent ethylenically unsaturated bonds. Here, the plurality of independent ethylenically unsaturated bonds indicates a plurality of ethylenically unsaturated bonds which do not form conjugated diene with each other.

For example, the cross-linking structure may be formed with a polymer having a first reactive functional group and a cross-linking agent having a plurality of second reactive functional groups reactive with the first reactive functional group, or may be formed by reacting a polymer having both of a first reactive functional group and a second reactive functional group in the molecule or between molecules. By forming the polymer (E) into a cross-linking copolymer, the water resistance, moisture resistance, and heat resistance of a solid electrolyte obtained using this are likely to be enhanced.

When a cross-linking agent is not used, the content of the constitutional unit forming the cross-linking structure is preferably 50% by mass or less, more preferably 30% by mass or less, still more preferably 15% by mass or less in 100% by mass of the polymer (E).

When a cross-linking agent is used, the total content of the constitutional unit forming the cross-linking structure and a configuration derived from the cross-linking agent is preferably 50% by mass or less, more preferably 30% by mass or less, still more preferably 15% by mass or less in 100% by mass of the polymer (E).

Examples of the compound forming the cross-linking structure include epoxy group-containing α,β-ethylenically unsaturated compounds such as glycidyl (meth)acrylate; hydrolyzable alkoxysilyl group-containing α,β-ethylenically unsaturated compounds such as vinyl triethoxysilane and γ-methacryloxypropyltrimethoxysilane; and polyfunctional vinyl compounds such as ethylene glycol di(meth)acrylate, trimethylolpropane tri(meth)acrylate, allyl(meth)acrylate, divinylbenzene, and diallyl phthalate. Alternatively, a cross-linkable monomer such as a carbonyl group-containing α,β-ethylenically unsaturated compound (ketone group-containing compound) in combination with a polyhydrazine compound (in particular, a compound having two or more hydrazide groups, such as oxalic acid dihydrazide, succinic acid dihydrazide, adipic acid dihydrazide, or polyacrylic acid hydrazide) may be cross-linked.

The polymer (E) is preferably obtained in the form of a polymer (E)-containing dispersion where the polymer (E) is dispersed in a dispersion medium, and more preferably is obtained in the form of an emulsion.

From the viewpoint of dispersion stability and sedimentation suppress, particles contained in the polymer (E)-containing dispersion has a 50% volume cumulative particle diameter ($d_{50}$) of preferably 0.01 to 10 μm, more preferably 0.05 to 1 μm, still more preferably 0.1 to 0.8 μm, further still more preferably 0.3 to 0.6 μm.

The $d_{50}$ is determined by a method Examples described later.

The polymer (E) can be produced by a radical polymerization reaction under normal pressure or in a pressure-resistant reactor in any production method of batch-wise, semi-continuous, and continuous methods. The polymer (E) is preferably produced through emulsion polymerization by continuously or intermittently adding a raw material solution containing an ethylenically unsaturated monomer to a polyanion-containing solution to cause polymerization. By emulsion polymerization, composite particles (2) are efficiently obtained, the composite particles (2) having a structure in which the polyanion is coordinated with the polymer (E) and a domain of the polyanion is formed on the outside of the domain of the polymer (E).

The polyanion used here may have the same structure as that of the polyanion (B), or may have a different structure (e.g., structure where a different cation is attached).

From the viewpoint of a suppression in increase in viscosity of the polymer (E)-containing dispersion and the dispersion stability, the blending amount of the ethylenically unsaturated monomer used in synthesis of the polymer (E) is preferably 10 to 100 parts by mass, more preferably 20 to 90 parts by mass, still more preferably 30 to 80 parts by mass relative to 100 parts by mass of the polyanion.

The dispersion medium used in synthesis of the polymer (E) is preferably an aqueous medium, more preferably water or a mixed solvent of water and a water-soluble solvent. From the viewpoint of the dispersion stability of the particles in the polymerization reaction, the proportion of the water-soluble solvent in the mixed solvent is preferably 30% by mass or less. The dispersion medium used in synthesis of the polymer (E) may be the same components as those of the dispersion medium (D) contained in the conductive polymer-containing dispersion, or may be different components.

Examples of the water-soluble solvent include alcohols such as methanol, ethanol, isopropanol; ketones such as acetone; glycols such as ethylene glycol and propylene glycol; and ethers such as ethylene glycol monomethyl ether and ethylene glycol monobutyl ether.

From the viewpoint of the dispersion stability of the polymer (E)-containing dispersion, the content of the dispersion medium in the polymer (E)-containing dispersion is preferably 30 to 99% by mass, more preferably 50 to 95% by mass, still more preferably 70 to 90% by mass.

The polyanion contributes to the dispersion stability of the polymer (E)-containing dispersion. From the viewpoint of favorable dispersion stability, additives such as an emulsifier and aliphatic amines may be added to the polymer (E)-containing dispersion as needed. The types and amounts of the additives to be added are appropriately adjusted according to the contents and compositions of the ethylenically unsaturated monomer and the polyanion. These emulsifiers and aliphatic amines to be added to the polymer (E)-containing dispersion may be used alone or in combination.

Examples of the emulsifier include anionic surfactants such as alkyl sulfuric acid ester salts, alkylbenzene sulfonic acid salts, alkylsulfosuccinic acid salts, alkyldiphenyl ether disulfonic acid salts, polyoxyalkylene alkyl sulfuric acid salts, and polyoxyalkylene alkyl phosphoric acid esters; and nonionic surfactants such as polyoxyalkylene alkyl ethers, polyoxyalkylene alkyl phenol ethers, polyoxyalkylene fatty acid esters, and polyoxyalkylene sorbitan fatty acid esters.

Examples of aliphatic amines include primary amines such as octylamine, laurylamine, myristylamine, stearylamine, and oleylamine; secondary amines such as dioctylamine, dilaurylamine, distearylamine, and dioleylamine; and tertiary amines such as N,N-dimethyllaurylamine, N,N-dimethylmyristylamine, N,N-dimethylpalmitylamine, N,N-dimethylstearylamine, N,N-dimethylbehenylamine, N,N-dimethyloleylamine, N-methyldidecylamine, and N-methyldioleylamine.

From the viewpoint of the dispersion stability of the polymer (E)-containing dispersion, a water-soluble polymer such as polyvinyl alcohol, methylcellulose, carboxymethylcellulose, hydroxyethylcellulose, hydroxypropylcellulose, or polyvinylpyrrolidone may be contained therein in the range not imparting the properties of the conductive polymer-containing dispersion according to the present embodiment.

Examples of the polymerization initiator for a radical polymerization reaction for obtaining the polymer (E) include inorganic peroxides such as hydrogen peroxide, persulfuric acid, ammonium persulfate, potassium persulfate, and sodium persulfate; organic peroxides such as benzoyl peroxide and tert-butyl hydroperoxide; and azo compounds such as 2,2'-azobisisobutyronitrile and 4,4'-azobis(4-cyanovaleric acid). A redox polymerization may be performed using these polymerization initiators in combination with sodium sulfoxylate formaldehyde, ascorbic acids, sulfurous acid salts, tartaric acid or a salt thereof, or iron (II) sulfate. Moreover, a chain transfer agent such as an alcohol or a mercaptan may be used as needed.

The reaction temperature in the radical polymerization reaction is preferably 10 to 100° C., more preferably 30 to 90° C. The reaction time is not particularly limited, and is appropriately adjusted according to the amounts of the raw materials, the type of the polymerization initiator, and the reaction temperature.

The reaction product obtained by the radical polymerization reaction is preferably desalted from the viewpoint of quality stability of the polymer (E)-containing dispersion. The salting method is not particularly limited, and a known method can be used. Examples thereof include dialysis, centrifugal washing, and ion exchange using an ion exchange resin.

(Alkaline Compound (F))

To adjust the pH and suppress corrosion of a metal in contact, the conductive polymer-containing dispersion according to the present embodiment may contain an alkaline compound (F).

To suppress corrosion of a metal in contact with the conductive polymer-containing dispersion and suppress dedoping of the polyanion (B) from the conjugated conductive polymer (A), the content of the alkaline compound (F) in the conductive polymer-containing dispersion is controlled in an amount such that the pH of the conductive polymer-containing dispersion is preferably 3 to 13, more preferably 3 to 8, still more preferably 4 to 7. The content of the alkaline compound (F) in the conductive polymer-containing dispersion is preferably 0 to 15% by mass, more preferably 0.05 to 10% by mass, still more preferably 0.1 to 5% by mass.

The alkaline compound is not particularly limited, and organic or inorganic alkaline compounds can be used. These alkaline compounds (F) can be used alone or in combination.

Examples of organic alkaline compounds include aromatic amines, aliphatic amines, heterocyclic amines, and alkali metal alkoxides.

Examples of aromatic amines include nitrogen-containing heteroaryls such as pyridines, imidazoles, pyrimidines, pyrazines, and triazines. Among these, pyridines, imidazoles, and pyrimidines are preferred from the viewpoint of solubility.

Examples of aliphatic amines include ethylamine, n-octylamine, diethylamine, diisobutylamine, methylethylamine, trimethylamine, triethylamine, allylamine, 2-ethylaminoethanol, 2,2'-iminodiethanol, and N-ethylethylenediamine.

Examples of heterocyclic amines include azetidines, pyrrolidines, piperidines, piperazines, morpholines, and thiomorpholines. Among these, morpholines are preferred from the viewpoint of general versatility.

Specific examples of morpholines include morpholine, 4-methylmorpholine, 4-ethylmorpholine, 4-n-propylmorpholine, 4-isopropylmorpholine, 4-n-butylmorpholine, 4-isobutylmorpholine, 4-pentylmorpholine, 4-hexylmorpholine, (R)-3-methylmorpholine, (S)-3-methylmorpholine, cis-2,6-dimethylmorpholine, 4-(1-cyclohexenyl) morpholine, 1-morpholino-1-cyclopentene, 4-phenylmorpholine, 4-(p-tolyl) morpholine, 4-(2-aminoethyl) morpholine, 4-(3-aminopropyl) morpholine, 2-morpholinoaniline, 4-morpholinoaniline, 4-(2-morpholinoethoxy) aniline, 4-(4-pyridyl) morpholine, 4-aminomorpholine, 4-(2-hydroxypropyl) morpholine, 4-(2-hydroxyethyl) morpholine, 4-(3-hydroxypropyl) morpholine, 2-hydroxy-3-morpholinopropane sulfonic acid, 2-morpholinoethanesulfonic acid, 3-morpholinopropanesulfonic acid, 4-acetylmorpholine, 4-acetoacetylmorpholine, 4-acryloylmorpholine, 4-allylmorpholine, phenylmorpholine, ethyl 3-(morpholino) propionate, 4-formylmorpholine, 4-(4-formylphenyl) morpholine, and salts thereof. Among these, morpholine, 4-ethylmorpholine, 4-n-butylmorpholine, 4-isobutylmorpholine, 4-phenylmorpholine, 4-(2-hydroxypropyl) morpholine, 4-(2-hydroxyethyl) morpholine, and 4-(3-hydroxypropyl) morpholine are preferred, at least one selected from the group consisting of morpholine, 4-ethylmorpholine, and 4-(2-hydroxyethyl) morpholine is more preferred, and morpholine is particularly preferred from the viewpoint of availability and handling properties.

Examples of alkali metal alkoxides include sodium alkoxides such as sodium methoxide and sodium ethoxide; potassium alkoxides; and calcium alkoxides.

Examples of inorganic alkaline compounds include ammonia, sodium hydroxide, potassium hydroxide, calcium hydroxide, and ammonia.

(Other Additives)

To impart physical properties suitable for the solid electrolytic capacitor, the conductive polymer-containing dispersion according to the present embodiment may contain other additives which do not correspond to the conjugated conductive polymer (A), the polyanion (B), the additive (C), the dispersion medium (D), the polymer (E), and the alkaline compound (F). The types and contents of other additives are not particularly limited.

Examples of other additives include water-soluble polymer compounds, water-dispersible compounds, surfactants, defoamers, coupling agents, and antioxidants. These other additives may be used alone or in combination.

The water-soluble polymer compounds and the water-dispersible compounds can have action to adjust the viscosity of the conductive polymer-containing dispersion and improve application performance.

When at least one of the water-soluble polymer compounds and the water-dispersible compounds is contained, the total content of the water-soluble polymer compounds and the water-dispersible compounds is preferably 1 to 50 parts by mass, more preferably 2 to 40 parts by mass, still more preferably 3 to 30 parts by mass per 1 part by mass of the polymer components contained in the conductive polymer-containing dispersion.

Examples of the water-soluble polymer compound include polyoxyalkylenes, water-soluble polyurethanes, water-soluble polyesters, water-soluble polyamides, water-soluble polyimides, water-soluble polyacrylics, water-soluble polyacrylamides, polyvinyl alcohol, and polyacrylic acid. Among these, polyoxyalkylenes are preferred.

Examples of polyoxyalkylenes include oligopolyethylene glycol, triethylene glycol monochlorohydrin, diethylene glycol monochlorohydrin, oligoethylene glycol monochlorohydrin, triethylene glycol monobromhydrin, diethylene glycol monobromhydrin, oligoethylene glycol monobromhydrin, polyethylene glycol, glycidyl ethers, polyethylene glycol glycidyl ethers, polyethylene oxide, triethylene glycol·dimethyl ether, tetraethylene glycol·dimethyl ether, diethylene glycol·dimethyl ether, diethylene glycol·diethyl ether·diethylene glycol·dibutyl ether, dipropylene glycol, tripropylene glycol, polypropylene glycol, polypropylenedioxide, polyoxyethylene alkyl ether, polyoxyethylene glycerol fatty acid esters, and polyoxyethylene fatty acid amides.

Preferably, the water-dispersible compounds are dispersed without deposited in water, for example, by substituting part of a compound having low hydrophilicity by a functional group having high hydrophilicity.

Examples of the water-dispersible compounds include polyester, polyurethane, acrylic resin, silicone resin, and compounds thereof modified by introducing a functional group. Examples thereof also include block copolymers and graft copolymers of acrylic resin with polyester or polyurethane.

Examples of surfactants include anionic surfactants such as carboxylic acid salts, sulfonic acid salts, sulfuric acid ester salts, and phosphoric acid ester salts; cationic surfactants such as amine salts and quaternary ammonium salts; amphoteric surfactants such as carboxybetaine, aminocarboxylic acid salts, and imidazolium betaine; and nonionic surfactants such as polyoxyethylene alkyl ethers, polyoxyethylene glycerol fatty acid esters, ethylene glycol fatty acid esters, and polyoxyethylene fatty acid amides.

Examples of defoamers include silicone resin, polydimethylsiloxane, and silicone oil.

Examples of antioxidants include phenol-based antioxidants, amine-based antioxidants, phosphorus-based antioxidants, sulfur-based antioxidants, and vitamins.

[Method for Producing Conductive Polymer-Containing Dispersion]

The conductive polymer-containing dispersion according to the present embodiment can be produced, for example, by polymerizing a monomer forming the constitutional unit of the conjugated conductive polymer (A) in a raw material solution (1) containing the monomer forming the constitutional unit of the conjugated conductive polymer (A) and a polyanion, and adding the hydroxyl group-containing cyclic ether compound (C). The raw material solution (1) may contain the polymer (E). The alkaline compound (F) and other additives may be optionally added. The polymer (E) may form a composite form with the polyanion, or may form a composite form in which the polyanion is coordinated on the outside of the domain of the polymer (E). The polymer (E) may be added as the above-mentioned polymer (E)-containing dispersion.

As described above, the polyanion used in the process of producing the conductive polymer-containing dispersion may have the same structure as that of the polyanion (B) contained in the conductive polymer-containing dispersion, or may have a different structure (e.g., structure where a cation is attached).

To suppress local progression of the polymerization reaction, in the raw material solution (1), the monomer forming the constitutional unit of the conjugated conductive polymer (A) is preferably dissolved, emulsifies, or dispersed. The raw material solution (1) can be prepared, for example, by stirring with a stirrer such as a homomixer or a homogenizer or by ultrasonic irradiation.

Even when a mixture containing the polyanion and the polymer (E) such as the polymer (E)-containing dispersion is used in preparation of the raw material solution (1), a polyanion may be further added to suppress aggregation of particles in the raw material solution (1). The raw material solution (1) may contain composite particles (2) having a composite form where the polyanion is coordinated on the outside of the domain of the polymer (E), and the polyanion additionally added. The polyanion additionally added may be the same as the polyanion which forms a composite form with the polymer (E), or may be a different component. Preferably, the polyanion is the same as the polyanion which forms a composite form with the polymer (E).

The amount of the polyanion additionally added is preferably 99% by mass or less, more preferably 10 to 90% by mass, still more preferably 30 to 80% by mass, further still more preferably 40 to 70% by mass in 100% by mass of the total polyanion in the raw material solution (1).

From the viewpoint of the dispersion stability of the conductive polymer-containing dispersion and a reduction in ESR of the solid electrolytic capacitor produced using the conductive polymer-containing dispersion, the total content of the polyanion is contained in the raw material solution (1) in an amount such that the anionic group per mol of the monomer forming the constitutional unit of the conjugated conductive polymer (A) is preferably 0.25 to 30 mol, more preferably 0.5 to 25 mol, still more preferably 0.8 to 20 mol.

Examples of the dispersion medium in the raw material solution (1) include water; amides such as N-vinylpyrrolidone, hexamethylphosphoramide, N-vinylformamide, and N-vinylacetoamide; phenols such as cresol, phenol, and xylenol; polyhydric alcohols such as dipropylene glycol, 1,3-butylene glycol, 1,4-butylene glycol, diglycerol, isoprene glycol, butanediol, 1,5-pentanediol, 1,6-hexanediol, 1,9-nonanediol, and neopentyl glycol; carbonates such as ethylene carbonate and propylene carbonate; ethers such as dioxane, diethyl ether, propylene glycol dialkylether, polyethylene glycol dialkylether, and polypropylene glycol dialkylether; heterocyclic compounds such as 3-methyl-2-oxazolidinone; and nitriles such as acetonitrile, glutarodinitrile, methoxyacetonitrile, propionitrile, and benzonitrile. These dispersive media may be used alone or in combination. The dispersion medium preferably contains water. In this case, the water content in 100% by mass of the dispersion medium is preferably 1% by mass or more, more preferably 50% by mass or more, still more preferably 100% by mass.

From the viewpoint of ease in production of the conductive polymer-containing dispersion, the dispersion medium in the raw material solution (1) is preferably the same component as that in the dispersion medium (D) of the conductive polymer-containing dispersion.

From the viewpoint of appropriate viscosity and reactivity during the polymerization reaction, the content of the dispersion medium in the raw material solution (1) is preferably 1 to 99.9% by mass, more preferably 10 to 99% by mass, still more preferably 30 to 98% by mass.

The polymerization reaction for synthesizing the conjugated conductive polymer (A) is preferably performed in the presence of an oxidant.

Examples of the oxidant include peroxodisulfuric acid salts such as peroxodisulfuric acid, ammonium peroxodisulfate, sodium peroxodisulfate, and potassium peroxodisulfate; metal halides such as boron trifluoride; transition metal compounds such as iron (III) chloride, iron (III) sulfate, and copper (II) chloride; metal oxides such as silver oxide and cesium oxide; peroxides such as hydrogen peroxide and ozone; organic peroxides such as benzoyl peroxide; and oxygen. Among these, peroxodisulfuric acid, peroxodisulfuric acid salts, and transition metal compounds are preferred, and peroxodisulfuric acid salts and transition metal compounds are more preferred. These oxidants may be used alone or in combination.

From the viewpoint of appropriate promotion of the polymerization reaction, the amount of the oxidant to be used is preferably 50 to 1500 parts by mass, more preferably 70 to 1000 parts by mass, still more preferably 100 to 500 parts by mass relative to 100 parts by mass of the monomer forming the constitutional unit of the conjugated conductive polymer (A).

From the viewpoint of an appropriate reaction rate and a suppression in increase in viscosity of the reaction solution, the temperature in the polymerization reaction is preferably 5 to 80° C., more preferably 10 to 60° C., still more preferably 15 to 40° C. The temperature may be appropriately changed according to the progression of the reaction.

To suppress aggregation of particles in the reaction solution, the polymerization reaction is preferably performed with stirring. The stirring method is not particularly limited, and examples thereof include a method of stirring using a high shear mixer or the like while circulating the reaction solution.

[Method for Producing Solid Electrolytic Capacitor]

The method for producing the solid electrolytic capacitor according to the present embodiment comprises a step of attaching the above-mentioned conductive polymer-containing dispersion according to the present embodiment to a porous anode body made of a valve metal and having a dielectric coating film on a surface thereof, and removing the dispersion medium (D) from the dispersion attached to the porous anode body to form a solid electrolyte layer.

By forming the solid electrolyte layer in such a step using the conductive polymer-containing dispersion according to the present embodiment, a solid electrolytic capacitor having low ESR can be suitably produced.

Examples of the valve metal include aluminum, beryllium, bismuth, magnesium, germanium, hafnium, niobium, antimony, silicon, tin, tantalum, titanium, vanadium, tungsten, zirconium, and alloys or compounds containing at least one of these metals. Among these, aluminum, niobium, and tantalum are preferred from the viewpoint of general versatility.

The porous anode body can be produced by forming a dielectric film on the surface of a porous valve metal.

The porous valve metal can be obtained, for example, by sintering a valve metal powder having a high specific surface area or etching a valve metal foil.

The dielectric film can be formed as a dielectric oxide film on the surface of the porous valve metal, for example, by anode oxidation of the porous valve metal in a phosphoric acid salt solution. The anodization voltage in anode oxidation is set according to the thickness of the dielectric oxide film and the withstand voltage of the capacitor, and is preferably 1 to 800 V, more preferably 1 to 500 V, more preferably 1 to 300 V.

The conductive polymer-containing dispersion can be attached to the porous anode body by a method such as application, spraying, or immersion, for example. Among these methods, a method of immersing the porous anode body into the conductive polymer-containing dispersion is preferred because the conductive polymer-containing dispersion can be thoroughly and uniformly permeated into and attached to the porous anode body. Alternatively, the porous anode body may be impregnated with the conductive polymer-containing dispersion reduced pressure to sufficiently permeate the conductive polymer-containing dispersion into fine portions of pores of the porous anode body.

When the conductive polymer-containing dispersion is attached to the porous anode body by immersion, usually, the porous anode body is impregnated with the conductive polymer-containing dispersion of about 10 to 35° C. for about 10 seconds to 10 minutes, although it depends on the type and viscosity of the dispersion medium (D) in the conductive polymer-containing dispersion.

From the viewpoint of removal efficiency, the dispersion medium (D) is preferably removed by drying the porous anode body, to which the conductive polymer-containing dispersion is attached, by a heat treatment. The heating conditions are appropriately set in consideration of the boiling point of the dispersion medium (D), the volatility, and oxidative degradation of the polymer components, and usually, the heat treatment is performed at room temperature to 300° C., preferably 40 to 250° C., more preferably 50 to 200° C. for 5 seconds to a few hours. The heating apparatus to be used can be a hot plate, an oven, or a hot air dryer, for example. From the viewpoint of drying efficiency, drying may be performed under reduced pressure.

The removal of the dispersion medium (D) here indicates not only that a state where the dispersion medium (D) is completely absent, but also that part of the dispersion medium may be preset in the range not obstructing production of the solid electrolytic capacitor.

To obtain an even thickness of the solid electrolyte layer, the above-mentioned steps may be repeatedly performed.

The solid electrolyte layer formed in the steps above may be impregnated with any electrolyte solution. Examples of an electrolyte solution with which the solid electrolyte layer is impregnated include polar organic solvents which may contain a salt.

The polar organic solvents for the electrolyte solution to be used can be protic solvents, and examples thereof include monohydric alcohols such as ethanol, propanol, butanol, pentanol, hexanol, cyclobutanol, cyclopentanol, cyclohexanol, and benzyl alcohol; and polyhydric alcohols and oxyalcohol compounds such as ethylene glycol, diethylene glycol, propylene glycol, glycerol, methylcellosolve, ethylcellosolve, methoxypropylene glycol, dimethoxypropanol, polyethylene glycol, and alkylene oxide adducts of polyoxyethylene glycerol.

Non-protic solvents can also be used as the polar organic solvent, and examples thereof include sulfones such as dimethylsulfone, ethylmethylsulfone, diethylsulfone, sulfolane, 3-methylsulfolane, and 2,4-dimethylsulfolane; amides such as N-methylformamide, N,N-dimethylformamide, N-ethylformamide, N,N-diethylformamide, N-methylacetoamide, N,N-dimethylacetamide, N-ethylacetoamide, N,N-diethylacetamide, and hexamethylphophoric amide; lactones and amides such as γ-butyrolactone, γ-valerolactone, δ-valerolactone, N-methyl-2-pyrrolidone, ethylene carbonate, propylene carbonate, butylene carbonate, and isobutylene carbonate; nitriles such as acetonitrile, 3-methoxypropionitrile, and glutaronitrile; and oxides such as dimethyl sulfoxide.

Examples of the salt include ammonium salts; quaternary ammonium salts such as tetramethylammonium salts, triethylmethylammonium salts, and tetraethylammonium salts; amidinium salt such as ethyldimethylimidazolinium salts and tetramethylimidazolinium salts; primary amine salts such as methylamine salts, ethylamine salts, and propylamine salts; secondary amine salts such as dimethylamine salts, diethylamine salts, ethylmethylamine salts, and dibutylamine salts; tertiary amine salts such as trimethylamine salts, triethylamine salts, tributylamine salts, ethyldimethylamine salts, and ethyldiisopropylamine salts; sodium salts; and potassium salts.

Examples of acids constituting salts include carboxylic acids such as oxalic acid, succinic acid, glutaric acid, pimelic acid, suberic acid, sebacic acid, phthalic acid, isophthalic acid, terephthalic acid, maleic acid, adipic acid, benzoic acid, toluic acid, enanthic acid, malonic acid, 1,6-decanedicarboxylic acid, 1,7-octanedicarboxylic acid, azelaic acid, resorcylic acid, phloroglucinic acid, gallic acid, gentisic acid, protocatechuic acid, pyrocatechuic acid, trimellitic acid, and pyromellitic acid; and organic acids such as sulfonic acid. Examples thereof also include boric acid, phosphoric acid, phosphorous acid, hypophosphorous acid, carbonic acid, and silicic acid. Examples thereof also include boron complexes such as borodisalicylic acid, borodioxalic acid, borodiglycolic acid, borodimalonic acid, borodisuccinic acid, borodiadipic acid, borodiazelaic acid, borodibenzoic acid, borodimaleic acid, borodilactic acid, borodimalic acid, boroditartaric acid, borodicitric acid, borodiphthalic acid, borodi (2-hydroxy) isobutyric acid, borodiresorcylic acid, borodimethylsalicylic acid, borodinaphthoic acid, borodimandelic acid, and borodi (3-hydroxy) propionic acid.

The electrolyte solution may contain additives. Examples of additives include complexes of boric acid with polysaccharides such as mannite and sorbit; complexes of boric acid with polyhydric alcohols; boric acid esters; nitro compounds such as o-nitrobenzoic acid, m-nitrobenzoic acid, p-nitrobenzoic acid, o-nitrophenol, m-nitrophenol, p-nitrophenol, and p-nitrobenzyl alcohol; and phosphoric acid esters. These may be used alone or in combination.

The method for producing the solid electrolytic capacitor according to the present embodiment can be performed by using the conductive polymer-containing dispersion according to the present embodiment and optionally changing the production conditions in a traditional process of producing a solid electrolytic capacitor. Accordingly, the method for producing the solid electrolytic capacitor according to the present embodiment can produce a solid electrolytic capacitor having ESR lower than that of traditional solid electrolytic capacitors while an increase in production cost is suppressed without significantly changing the facility or the like in the traditional process of producing a solid electrolytic capacitor.

[Solid Electrolytic Capacitor]

The solid electrolytic capacitor according to the present embodiment comprises a solid electrolyte layer in a porous anode body made of a valve metal and having a dielectric coating film on a surface thereof, wherein the solid electrolyte layer contains the conjugated conductive polymer (A), the polyanion (B), and the additive (C). A solid electrolytic capacitor having such a configuration has low ESR.

Such a solid electrolytic capacitor can be suitably produced by the above-mentioned method for producing the solid electrolytic capacitor according to the present embodiment. The solid electrolyte layer may contain the above-mentioned electrolyte solution.

EXAMPLES

Hereinafter, the present invention will be more specifically described by way of Examples and Comparative Examples, but the present invention is not limited to Examples below.

[Measurement Method]

Methods for measuring a variety of physical properties in Examples and Comparative Examples are shown below.

(Weight Average Molecular Weight)

The weight average molecular weight (Mw) of sodium polystyrenesulfonate was determined by gel permeation chromatography as a standard polystyrene-based molecular weight measured under the following measurement conditions.

<Measurement Conditions>
- measurement apparatus: "Shodex (registered trademark) GPC 101", available from Resonac Corporation
- column used: "OHpak SB-806M HQ", available from Resonac Corporation
- column temperature: 40° C.
- eluate: water
- elution rate: 1 mL/min
- standard sample: polystyrene (50% Volume Cumulative Particle Diameter ($d_{50}$))

The 50% volume cumulative particle diameter ($d_{50}$) of the particles contained in the dispersion were measured with a particle diameter distribution analyzer (Microtrack (registered trademark) UPA type, available from NIKKISO CO., LTD.), and was calculated using the attached software (Microtrac II) on the following conditions for setting.

<Conditions for Setting>
- particles: transmissive, true spherical shape, refractive index: 1.59, density: 1.00 g/cm$^3$
- solvent: refractive index: 1.333, viscosity: 0.797 mPa·s (30° C.), 1.002 mPa·s (20° C.)

(Solid Content Concentration)

The solid content concentration was determined as follows: about 10 g of a dispersion sample was weighed, and using an infrared light aquameter ("FD-720", available from Kett Electric Laboratory Co. Ltd.), the dispersion sample was heated for 30 minutes at a temperature 10° C. higher than the boiling point of the dispersion medium having the highest boiling point among those of the dispersive media contained, and the solid content concentration was calculated where the residue after evaporation was regarded as the solid content. For example, when the dispersion medium is water, the heating is performed at 110° C. for 30 minutes.

(pH)

The pH of the composite particles-containing solution was measured with a pH meter ("HM-30G", available from DKK-TOA CORPORATION; 25° C.).

[Production of Conductive Polymer-Containing Dispersion]

Example 1

<Production of Polymer (E1)-Containing Dispersion>

86 g of styrene, 49 g of 2-ethylhexyl acrylate, 15 g of divinylbenzene, and 500 g (polysodium styrenesulfonate: 110 g) of a 22% by mass aqueous solution of polysodium styrenesulfonate ("PolyNaSS (registered trademark) PS-5", available form Tosoh Finechem Corporation; Mw: about 120000; the same is applied below) were mixed by stirring to prepare a raw material solution (a).

1000 g (polysodium styrenesulfonate: 220 g) of a 22% by mass aqueous solution of polysodium styrenesulfonate was heated to 80° C. with stirring, and 2 g of potassium persulfate was added thereto to prepare a raw material solution (b).

The raw material solution (a) was added dropwise to the raw material solution (b) over 2 hours, and further, 40 g of a 2.5% by mass aqueous solution of potassium persulfate was added dropwise over 2.5 hours. These were reacted at 80° C. for 2 hours, and then were cooled to room temperature (25° C.).

1500 mL of a cation exchange resin ("Amberlite (registered trademark) IR120B-H", available from ORGANO CORPORATION; the same is applied below) and 1500 mL of an anion exchange resin ("Amberlite (registered trademark) IRA410-OH", available from ORGANO CORPORATION; the same is applied below) were added to the reaction product, and these were stirred for 12 hours. Thereafter, the ion exchange resins were separated by filtration. Pure water was added to obtain a polymer (E1)-containing dispersion containing a polyanion (B1) and a polymer (E1). The particles contained in the polymer (E1)-containing dispersion (solid content concentration 15.0% by mass) had a $d_{50}$ of 0.46 μm.

<Preparation of Raw Material Solution (1-1)>

In a 1-L vessel made of polyethylene, 34.0 g of the polymer (E1)-containing dispersion, 31.5 g (polysodium styrenesulfonate: 3.78 g) of a 12% by mass aqueous solution of polysodium styrenesulfonate, and 223.2 g of pure water were mixed with stirring at 32° C. 2.80 g of 3,4-ethylenedioxythiophene was added thereto, and mixed and emulsified for 30 minutes with a homomixer ("ROBOMIX (registered trademark)", available from PRIMIX Corporation; 4000 rpm; the same is applied below) to prepare a raw material solution (1-1) (total content of polysodium styrenesulfonate: 1.9 mol of sulfonic acid sodium group per mol of 3,4-ethylenedioxythiophene).

<Production of Conjugated Conductive Polymer (A1)>

291.5 g of the raw material solution (1-1) was placed into a stainless steel vessel connected to a high shear mixer ("MILDER (registered trademark) MDN303V", available from Pacific Machinery & Engineering Co., Ltd.; 5000 rpm, 32° C.) and a circulation pump, and was stirred while being circulated with a stirring blade and a high shear mixer. 5.89 g of sodium peroxodisulfate and 6.88 g of a 1% by mass aqueous solution of iron (III) sulfate hexahydrate were added, and a polymerization reaction was performed for 24 hours to obtain an intermediate generation solution (2) (solid content concentration: 5.80% by mass) containing a conductive polymer.

The steps of preparing the raw material solution (1-1) and of producing the conjugated conductive polymer (A1) were repeated, and the intermediate generation solution (2) containing 1223.3 g of the conductive polymer in total was recovered.

(Step of Synthesizing Conjugated Conductive Polymer (A))

291.5 g of the raw material solution (A) was placed into a stainless steel vessel connected to a high shear mixer ("MILDER (registered trademark) MDN303V", available from Pacific Machinery & Engineering Co., Ltd.; 5000 rpm, 32° C.) and a circulation pump, and was stirred while being circulated with a stirring blade and a high shear mixer. 5.89 g of sodium peroxodisulfate and 6.88 g of a 1% by mass aqueous solution of iron (III) sulfate hexahydrate were added, and a polymerization reaction was performed for 24 hours to obtain an intermediate dispersion containing a conductive polymer (solid content concentration measured with an infrared aquameter: 5.80% by mass).

Using the third polymer-containing dispersion obtained in the third polymer synthesis step, the steps of preparing the raw material solution and of synthesizing the conjugated conductive polymer (A) were repeated, and 1223.3 g of an intermediate dispersion in total was recovered.

<Dispersion and Desalting>

1223.3 g of the intermediate generation solution (2) was diluted into 1500 mL with pure water (solid content concentration: 4.73% by mass), and then was dispersed for 45 minutes with a high pressure homogenizer ("TwinPanda 600", available from Niro Soavi; 400 bar (40 MPa); the same is applied below). Further, pure water was added to dilute the solution to have a solid content concentration of 3.99% by mass. Thereafter, 1500 mL of the diluted solution was extracted, and was dispersed for 135 minutes with a high pressure homogenizer to obtain a dispersion (3) containing the conductive polymer.

The dispersion (3) was desalted by ion exchange with 125.6 mL of a cation exchange resin and 109.9 mL of an anion exchange resin for 3 hours to obtain a dispersion (4) containing the conductive polymer (pH: 1.9, solid content concentration: 1.65% by mass).

<Production of Conductive Polymer-Containing Dispersion>

7.5 g of morpholine and 22.5 g of pure water were added to 1000 g of the dispersion (4) to adjust the pH to 4.7 (solid content concentration: 1.60% by mass). Further, 103 g (6.3 parts by mass relative to 1 part by mass the solid content in the dispersion after desalting) of 2,2-dimethyl-1,3-dioxolane-4-methanol as the additive (C) was added to produce a conductive polymer-containing dispersion (content of 2,2-dimethyl-1,3-dioxolane-4-methanol: 9% by mass).

Examples 2 to 6, Comparative Examples 1 and 2

Conductive polymer-containing dispersions were produced in the same manner as in Example 1 except that the type or amount of the additive (C) in Example 1 was varied as shown in Table 2.

Example 7

In a 1-L vessel made of polyethylene, 63.0 g (polysodium styrenesulfonate: 7.56 g) of a 12% by mass aqueous solution of polysodium styrenesulfonate and 225.7 g of pure water were mixed with stirring at 32° C. 2.80 g of 3,4-ethylenedioxythiophene was added thereto, and these were mixed and emulsified for 30 minutes with a homomixer to prepare a raw material solution (1-2) (total content of polysodium styrenesulfonate: 2.0 mol of a sulfonic acid sodium group per mol of 3,4-ethylenedioxythiophene).

A conductive polymer-containing dispersion was produced in the same manner as in Example 1 after the steps of producing the conjugated conductive polymer (A1) except that the raw material solution (1-1) in Example 1 was replaced by the raw material solution (1-2).

Examples 8 to 12, Comparative Examples 3 and 4

Conductive polymer-containing dispersions were produced in the same manner as in Example 7 except that the type or amount of the additive (C) in Example 7 was varied as shown in Table 2.

The parameters related to the HSP coordinate system of the additive (C) used in Examples and Comparative Examples and the molecular weight per one hydroxyl group are shown in Table 1. The numeric values of the parameters of the HSP coordinate system for polystyrenesulfonic acid are also shown.

TABLE 1

| | HSP coordinate system [MPa$^{0.5}$] | | | | | Molecular weight per one hydroxyl group |
|---|---|---|---|---|---|---|
| | $\delta D_1$ | $\delta P_1$ | $\delta H_1$ | $|\delta H_1 - \delta H_2|$ | Ra | |
| 2,2-Dimethyl-1,3-dioxolane-4-methanol | 16.8 | 7.5 | 11.0 | 2.7 | 4.9 | 132 |
| 4-Hydroxymethyl-1,3-dioxolan-2-one | 18.5 | 21.8 | 14.5 | 0.8 | 10.8 | 118 |
| 2,2-Dimethyl-1,3-dioxolane-4-ethanol | 16.7 | 7.0 | 10.1 | 3.6 | 5.9 | 146 |
| 1,3-Dioxan-5-ol | 18.2 | 10.6 | 15.1 | 1.4 | 1.7 | 104 |
| Ethylene glycol | 17.8 | 13.5 | 27.4 | 13.7 | 13.9 | 31 |
| | $\delta D_2$ | $\delta P_2$ | $\delta H_2$ | | | |
| Polystyrenesulfonic acid | 17.8 | 11.1 | 13.7 | | | |

[Production of Solid Electrolytic Capacitor]

Using the conductive polymer-containing dispersions produced in Examples and Comparative Examples above, solid electrolytic capacitors were produced as follows.

Porous anode bodies for an aluminum electrolytic capacitor element (withstand voltage: 35 V, designed capacitance: 400 µF) were impregnated with the conductive polymer-containing dispersions under an air atmosphere at 25° C. for 5 minutes, and were dried with a hot air dryer ("ST-110", available from ESPEC Corp.) at 120° C. for 30 minutes to obtain solid electrolytic capacitors each including a solid electrolyte layer on the surface of a dielectric oxide film in the porous anode body.

The solid electrolytic capacitors were measured for capacitance [µF] at 120 Hz and equivalent series resistance (ESR) [mΩ] at 100 kHz with a precision LCR meter ("E4980A", available from Agilent Technologies, Inc.).

These results of measurements are shown in Table 2.

TABLE 2

| | | Additive (C) | | | Solid electrolytic capacitor | |
|---|---|---|---|---|---|---|
| | Polymer (E) | Type | Per 1 part by mass of polymer component [parts by mass] | In conductive polymer-containing dispersion [% by mass] | Capacitance (120 Hz) [μF] | ESR (100 kHz) [mΩ] |
| Example 1 | Present | 2,2-Dimethyl-1,3-dioxolane-4-methanol | 6.3 | 9 | 389 | 14.2 |
| Example 2 | | | 12.5 | 17 | 399 | 10.5 |
| Example 3 | | | 18.8 | 23 | 390 | 10.1 |
| Example 4 | | 4-Hydroxymethyl-1,3-dioxolan-2-one | 6.3 | 9 | 390 | 11.3 |
| Example 5 | | 2,2-Dimethyl-1,3-dioxolane-4-ethanol | 6.3 | 9 | 359 | 13.2 |
| Example 6 | | 1,3-Dioxan-5-ol | 6.3 | 9 | 330 | 18.1 |
| Comparative Example 1 | | Ethylene glycol | 6.3 | 9 | 383 | 21.0 |
| Comparative Example 2 | | — | — | — | 289 | 68.3 |
| Example 7 | Absent | 2,2-Dimethyl-1,3-dioxolane-4-methanol | 6.3 | 9 | 215 | 14.3 |
| Example 8 | | | 12.5 | 17 | 231 | 11.0 |
| Example 9 | | | 18.8 | 23 | 208 | 11.0 |
| Example 10 | | 4-Hydroxymethyl-1,3-dioxolan-2-one | 6.3 | 9 | 276 | 10.3 |
| Example 11 | | 2,2-Dimethyl-1,3-dioxolane-4-ethanol | 6.3 | 9 | 197 | 13.5 |
| Example 12 | | 1,3-Dioxan-5-ol | 6.3 | 9 | 223 | 15.7 |
| Comparative Example 3 | | Ethylene glycol | 6.3 | 9 | 314 | 16.1 |
| Comparative Example 4 | | — | — | — | 230 | 73.1 |

The results shown in Table 2 revealed that by using the conductive polymer-containing dispersions containing the additive (C) where the hydrogen bond term δH, as the HSP is 5.0 to 20 MPa$^{0.5}$ (Examples 1 to 12), solid electrolytic capacitors having lower ESR can be produced without significantly reducing the capacitance.

The invention claimed is:

1. A conductive polymer-containing dispersion comprising a conjugated conductive polymer (A), a polyanion (B), an additive (C), and a dispersion medium (D),
wherein a hydrogen bond term δH$_1$ of the additive (C) as a Hansen solubility parameter is 5.0 to 20.0 MPa$^{0.5}$.

2. The conductive polymer-containing dispersion according to claim 1, wherein a content of the additive (C) is 1 to 50 parts by mass per 1 part by mass of the total amount of the conjugated conductive polymer (A) and the polyanion (B).

3. The conductive polymer-containing dispersion according to claim 1, further comprising a polymer (E) that does not correspond to any one of the conjugated conductive polymer (A) and the polyanion (B) and that does not dissolve in the dispersion medium (D).

4. The conductive polymer-containing dispersion according to claim 3, wherein a content of the additive (C) is 1 to 50 parts by mass per 1 part by mass of the total amount of the conjugated conductive polymer (A), the polyanion (B), and the polymer (E).

5. The conductive polymer-containing dispersion according to claim 1, wherein the δH$_1$ of the additive (C) is 7.0 to 18.0 MPa$^{0.5}$.

6. The conductive polymer-containing dispersion according to claim 1, wherein the additive (C) has a hydroxyl group, and has a molecular weight per one hydroxyl group of 80 to 200.

7. The conductive polymer-containing dispersion according to claim 1, wherein the additive (C) is a compound constituted of a carbon atom, a hydrogen atom, and an oxygen atom.

8. The conductive polymer-containing dispersion according to claim 1, wherein |δH$_1$-δH$_2$|≤6.5 [MPa$^{0.5}$], where the hydrogen bond term of the polyanion (B) as the Hansen solubility parameter is defined as δH$_2$.

9. The conductive polymer-containing dispersion according to claim 1, wherein a distance Ra between coordinates (δD$_1$, δP$_1$, δH$_1$) and (δD$_2$, δP$_2$, δH$_2$) in a three-dimensional space of the Hansen solubility parameters is 20.0 MPa$^{0.5}$ or less, the distance Ra being represented by Ra={4×(δD$_1$-δD$_2$)$^2$+(δP$_1$-δP$_2$)$^2$+(δH$_1$-δH$_2$)$^2$}$^{0.5}$ where as the Hansen solubility parameters of the additive (C), the dispersion term is defined as δD$_1$, the polar term as δP$_1$, and the hydrogen bond term as δH$_1$, and as the Hansen solubility parameters of the polyanion (B), the dispersion term is defined as δD$_2$, the polar term as δP$_2$, and the hydrogen bond term as δH$_2$.

10. The conductive polymer-containing dispersion according to claim 1, wherein the polyanion (B) is a polymer having two or more groups composed of sulfonic acid or a salt thereof.

11. The conductive polymer-containing dispersion according to claim 1, wherein the dispersion medium (D) has a water content of 1 to 99% by mass.

12. The conductive polymer-containing dispersion according to claim 1, wherein the conjugated conductive polymer (A) is a polymer of a monomer containing one or more compounds selected from the group consisting of pyrroles, anilines, and thiophenes.

13. The conductive polymer-containing dispersion according to claim 12, wherein the thiophene compounds are represented by the following formula (1):

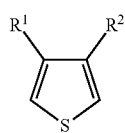
(1)

wherein $R^1$ and $R^2$ are each independently a hydrogen atom, a hydroxyl group, an optionally substituted alkyl group with 1 to 18 carbon atoms, an optionally substituted alkoxy group with 1 to 18 carbon atoms, or an optionally substituted alkylthio group with 1 to 18 carbon atoms; or $R^1$ and $R^2$ may bind to each other to form an optionally substituted alicyclic ring with 3 to 10 carbon atoms, an optionally substituted aromatic ring with 6 to 10 carbon atoms, an optionally substituted oxygen atom-containing hetero ring with 2 to 10 carbon atoms, an optionally substituted sulfur atom-containing hetero ring with 2 to 10 carbon atoms, or an optionally substituted sulfur atom and oxygen atom-containing hetero ring with 2 to 10 carbon atoms.

14. A method for producing a solid electrolytic capacitor, comprising a step of attaching the conductive polymer-containing dispersion according to claim 1 to a porous anode body made of a valve metal and having a dielectric coating film on a surface thereof, and removing the dispersion medium (D) to form a solid electrolyte layer.

15. A solid electrolytic capacitor comprising a solid electrolyte layer in a porous anode body made of a valve metal and having a dielectric coating film on a surface thereof,
wherein the solid electrolyte layer contains a conjugated conductive polymer (A), a polyanion (B), and an additive (C), and
the hydrogen bond term $\delta H_1$ of the additive (C) as the Hansen solubility parameter is 5.0 to 20.0 $MPa^{0.5}$.

* * * * *